(12) United States Patent
Taouil et al.

(10) Patent No.: US 11,869,612 B2
(45) Date of Patent: Jan. 9, 2024

(54) DEVICE AWARE TEST FOR MEMORY UNITS

(71) Applicant: Technische Universiteit Delft, Delft (NL)

(72) Inventors: Mottaqiallah Taouil, Delft (NL); Said Hamdioui, Delft (NL)

(73) Assignee: Technische Universiteit Delft, Delft (NL)

( * ) Notice: Subject to any disclaimer, the term of this patent is extended or adjusted under 35 U.S.C. 154(b) by 119 days.

(21) Appl. No.: 17/639,386

(22) PCT Filed: Sep. 3, 2020

(86) PCT No.: PCT/NL2020/050544
§ 371 (c)(1),
(2) Date: Mar. 1, 2022

(87) PCT Pub. No.: WO2021/045619
PCT Pub. Date: Mar. 11, 2021

(65) Prior Publication Data
US 2022/0351795 A1    Nov. 3, 2022

(30) Foreign Application Priority Data
Sep. 3, 2019 (NL) .................................. 2023751

(51) Int. Cl.
*G11C 29/00* (2006.01)
*G11C 29/10* (2006.01)

(52) U.S. Cl.
CPC .................................. *G11C 29/10* (2013.01)

(58) Field of Classification Search
None
See application file for complete search history.

(56) References Cited

U.S. PATENT DOCUMENTS 8,402,421 B2 * 3/2013 Bartenstein ......... G06F 11/2205
714/33
8,875,077 B1 10/2014 O'Riordan et al.
(Continued)

OTHER PUBLICATIONS

Kannan et al.: "Modeling, Detection, and Diagnosis of Faults in Multilevel Memristor Memories", IEEE Transactions on Computer-Aided Design of Integrated Circuits and Systems, IEEE Service Center, Piscataway, NJ, US, vol. 34, No. 5, May 1, 2015 (May 1, 2015), pp. 822-834, XP011578827.
(Continued)

*Primary Examiner* — Mujtaba M Chaudry
(74) *Attorney, Agent, or Firm* — N.V. Nederlandsch Octrooibureau

(57) ABSTRACT

Method for testing an integrated circuit device, by defect modelling of the integrated circuit device, fault modelling of the integrated circuit device based on the information obtained from the defect modelling, test development based on information obtained from the fault modelling, and executing the test on the integrated circuit device. Defect modelling of the integrated circuit device including executing a physical defect analysis of the integrated circuit device to provide a set of effective technology parameters modified from a set of defect-free technology parameters associated with the integrated circuit device, and executing an electrical modelling of the integrated circuit device using the set of effective technology parameters to provide a defect-parametrized electrical model based on a defect-free electrical model of the integrated circuit device. The present methods allow parts-per-billion testing capabilities.

10 Claims, 4 Drawing Sheets

(56) References Cited

U.S. PATENT DOCUMENTS

| | | |
|---|---|---|
| 9,086,459 B2 | 7/2015 | Guo et al. |
| 10,528,692 B1* | 1/2020 | Guo .................... G06F 30/327 |
| 10,592,625 B1* | 3/2020 | Tang ................ G01R 31/2894 |
| 2004/0205436 A1* | 10/2004 | Kundu .................... H04B 1/74 |
| 2005/0229121 A1* | 10/2005 | Hildebrant ..... G01R 31/318357 |
| | | 716/112 |
| 2006/0053357 A1* | 3/2006 | Rajski .............. G01R 31/31835 |
| | | 714/742 |
| 2007/0089001 A1* | 4/2007 | Hsu ................ G01R 31/318547 |
| | | 714/726 |
| 2007/0234161 A1* | 10/2007 | Blanton ........... G01R 31/31835 |
| | | 714/736 |
| 2009/0063062 A1* | 3/2009 | Takamatsu ......... G01R 31/3193 |
| | | 702/58 |
| 2009/0113265 A1* | 4/2009 | Cannon .......... G01R 31/318544 |
| | | 714/729 |
| 2009/0240458 A1* | 9/2009 | Desineni .......... G01R 31/31835 |
| | | 702/120 |
| 2013/0054161 A1 | 2/2013 | Hapke et al. |
| 2015/0234978 A1* | 8/2015 | Tang .................... G06F 30/398 |
| | | 716/112 |
| 2017/0193155 A1* | 7/2017 | Lin ................ G01R 31/318371 |
| 2018/0060472 A1* | 3/2018 | Chen ............. G01R 31/318342 |
| 2018/0253346 A1 | 9/2018 | Tang et al. |
| 2019/0050515 A1* | 2/2019 | Su .......................... G06N 3/045 |

OTHER PUBLICATIONS

Martin et al.: "Fault Detection and Diagnosis for Multi-Level Cell Flash Memories", IEEE Instrumentation and Measurement Technology Conferenced (IEEE Cat. No. 06CH37714C) IMTC, IEEE, Apr. 1, 2006 (Apr. 1, 2006), pp. 1896-1901, XP031057020.

Wu et al.: "Electrical Modeling of STT-MRAM Defects", 2018 IEEE International Test Conference (ITC), IEEE, Oct. 29, 2018 (Oct. 29, 2018), pp. 1-10, XP033508909.

Su et al.: "MRAM Defect Analysis and Fault Modeling", 2004 IEEE International Test Conference (ITC), IEEE, Oct. 26, 2004 (Oct. 26, 2004), pp. 124-133, XP010763828.

* cited by examiner

DEVICE AWARE TEST FOR MEMORY UNITS

FIELD OF THE INVENTION

The present invention relates to a method for testing an integrated circuit device.

BACKGROUND ART

In prior art test methods for integrated circuit devices such as (semiconductor) memory units, possible defects in a (part of) the device are modelled using external resistances, allowing only modelling of linear types of defects. E.g. linear resistors are added to a transistor level netlist for simulation and test of a memory unit. This is an insufficient manner for reaching parts-per-billion fault detection levels in advanced and new semiconductor memory units.

The article by Kannah Sachhidh et al: "Modelling and Diagnosis of Faults in Multilevel Memristor Memories", (DOI: 10.1109/TCAD.2015.2394434) proposes a testing technique that exploits sneak-paths inherent in crossbar memories to test several memory cells simultaneously by integrating solutions for detecting and locating faults in memristors. A hybrid diagnosis scheme is also proposed that uses a combination of sneak-path and March testing to reduce diagnosis time. The proposed schemes enable and leverage sneak-paths during fault detection and diagnosis modes, while disabling sneak-paths during normal operation. The proposed hybrid scheme reduces fault detection and diagnosis time by 24.69% and 28%, respectively, compared to traditional March tests.

The article by Robert R Martin et al: "Fault Detection and Diagnosis for Multi-Level Cell Flash Memories", (DOI: 10.1109/IMTC.2006.235838) provides a solution to test and diagnose an MLC flash memory array. The fault model proposed takes into account many physical defects which cause the state of a memory cell to change. The universal test algorithm and the flash diagnosis (FDX) march algorithm proposed in this paper are supposedly the first of its kind for MLC flash. Further, the full fault coverage for the fault model proposed in this paper is of low complexity and low test time, making them an 'attractive' methodology for testing and diagnosing faults for multilevel flash memories.

SUMMARY OF THE INVENTION

The present invention seeks to provide a test method for testing an integrated circuit device, to allow testing on a defective part per billion (DPPB) level.

According to the present invention, a method as defined above is provided, the method comprising defect modelling of the integrated circuit device, fault modelling of the integrated circuit device based on the information obtained from the defect modelling, test development based on information obtained from the fault modelling, and executing the test on the integrated circuit device. Defect modelling of the integrated circuit device comprises executing a physical defect analysis of the integrated circuit device to provide a set of effective technology parameters modified from a set of defect-free technology parameters associated with the integrated circuit device, and executing an electrical modelling of the integrated circuit device using the set of effective technology parameters to provide a defect-parametrized electrical model based on a defect-free electrical model of the integrated circuit device, wherein fault modelling comprises a fault analysis based on the defect-parametrized electrical model of the integrated circuit device, and wherein the fault analysis comprises defining a fault space comprising a description of a plurality of possible faults, and determining which of the plurality of possible faults can be sensitized during executing the test on the integrated circuit device.

This allows to provide a test approach which extends beyond a cell-aware test in relation to integrated circuit devices e.g. (semiconductor) memory devices as a device-aware test (DAT). The defect modeling of the present invention embodiments does not assume that a defect in a integrated circuit device (or a cell thereof) can only be modeled electrically as a linear resistor (as the traditional approach suggests), but it rather incorporates and captures the impact of the physical defect on the technology parameters of the integrated circuit device and thereafter on its electrical parameters. Once the defective electrical model is defined, a systematic fault analysis (based on fault simulation) is performed to derive appropriate fault models and thereafter test solutions. As a result, it is possible to provide a highly reliable test method enabling parts-per-billion fault detection levels.

SHORT DESCRIPTION OF DRAWINGS

The present invention will be discussed in more detail below, with reference to the attached drawings, in which FIG. 1 shows a schematic presentation of a defect modelling part of an embodiment of the device aware test according to the present invention, FIG. 2 shows a flow diagram of a fault modeling part of an embodiment of the device aware test according to the present invention;

DESCRIPTION OF EMBODIMENTS

Figure 1:
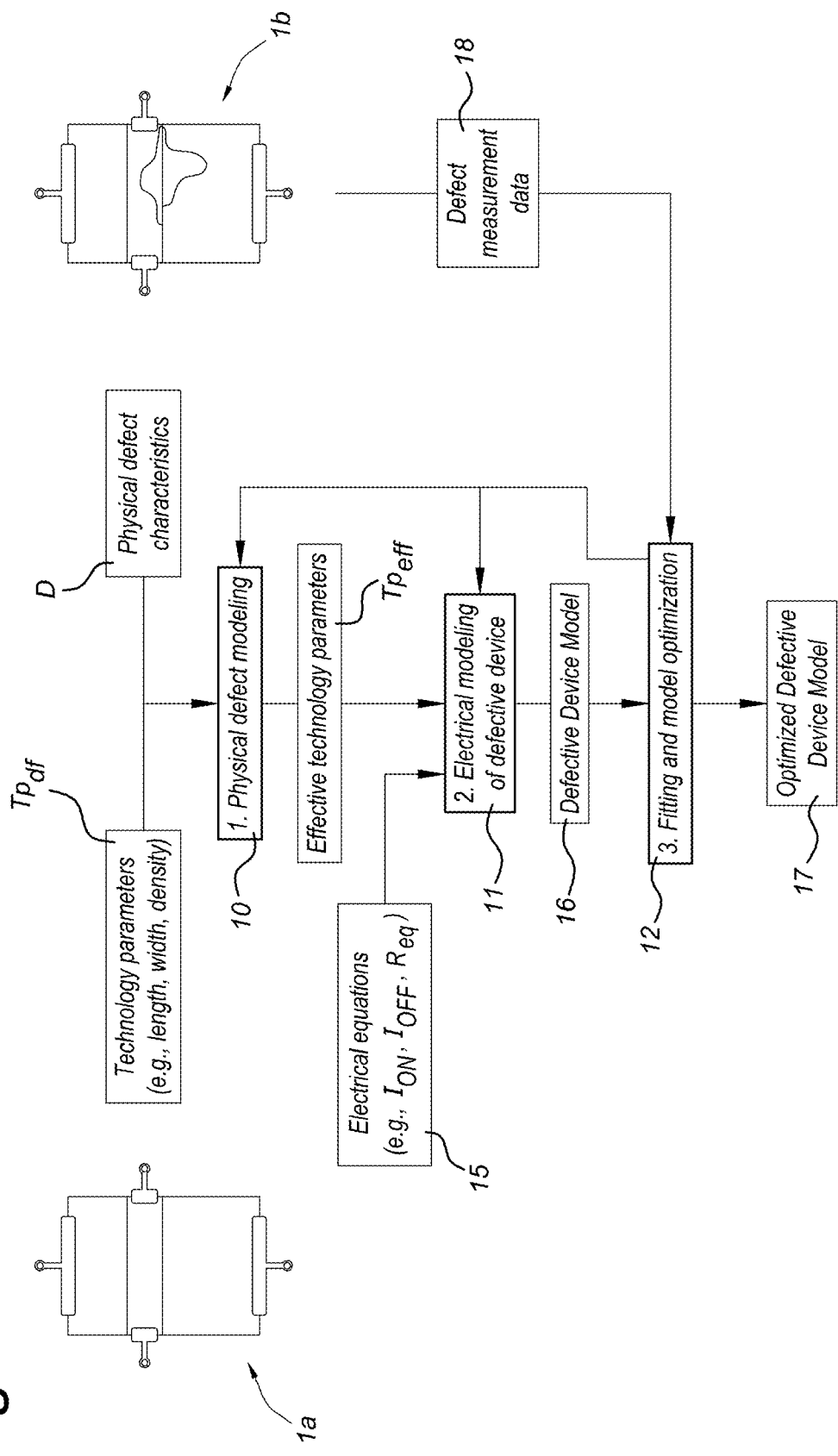

Technology scaling has driven the phenomenal success of the semiconductor industry in delivering larger, faster, and cheaper integrated circuits with a high quality of service. Silicon technology has entered the nano-era and 5 nm transistors are being prototyped. However, it is widely recognized that defects and variability in device characteristics during the fabrication process, and their impact on the overall quality and reliability of the system represent major challenges, especially when considering high-quality levels, e.g., defective part per billion (DPPB) level. Moreover, newly-emerging failure mechanisms in the nano-era are causing the fault mode of chips to be dominated by transient, intermittent, and weak faults rather than hard and permanent faults. This shift in failure mechanisms may impact the way fault modelling has been done. Note that accurate fault models which reflect the real defects of new technologies are a must for developing high defect coverage test solutions. High-quality testing is a very critical step in the whole design and manufacturing chain responsible for screening out all the defective chips before they are sold, as it is the last chance to deliver the required quality and reliability to the end customer. All of these indicate the necessity and the importance of high-quality test solutions.

The present invention embodiments relate to a test approach which extends beyond a cell-aware test in relation to integrated circuit devices 1, hereinafter indicated as device-aware test (DAT). The approach embodiments include three steps: defect modeling, fault modeling, and test (or design for test (DfT) development. The defect modeling of the present invention embodiments does not assume that a defect in an integrated circuit device 1 (or a cell thereof) can only be modeled electrically as a linear resistor (as the traditional approach suggests), but it rather incorporates and captures the impact of the physical defect on the technology parameters of the integrated circuit device 1 and thereafter on its electrical parameters. Once the defective electrical model is defined, a systematic fault analysis (based on fault simulation) is performed to derive appropriate fault models and thereafter test solutions.

In generic wording, the present invention embodiments relate to a method for testing an integrated circuit device 1, the method comprising defect modelling of the integrated circuit device 1, fault modelling of the integrated circuit device 1 based on the information obtained from the defect modelling, test development based on information obtained from the fault modelling, and executing the test on the integrated circuit device 1. Defect modelling of the integrated circuit device 1 comprises executing a physical defect analysis 10 of the integrated circuit device 1 to provide a set of effective technology parameters $Tp_{\mathit{eff}}$ modified from a set of defect-free technology parameters $Tp_{df}$ associated with the integrated circuit device 1 (e.g. length, width, density or cell structure), and executing an electrical modelling 11 of the integrated circuit device 1 using the set of effective technology parameters $Tp_{\mathit{eff}}$ to provide a defect-parametrized electrical model based on a defect-free electrical model of the integrated circuit device 1 (e.g., current, impedance, voltage, . . . ).

Instead of using a fault model derived from injecting linear resistors in transistor-level netlists representing the integrated circuit device 1, the present invention embodiments first change the electrical model of the defective device 1 (e.g., at transistor level) by incorporating the impact of the defect in the device's electrical parameters (model). In a further embodiment, defect modelling of the integrated circuit device 1 comprises defect modelling of parts of the integrated circuit device 1, e.g. at cell level, cell block level or at transistor level. The electrical model is then used to perform circuit simulation to derive the fault models and thereafter test solutions. The present invention embodiments employ a three-step DAT approach: defect modelling, fault modelling, and test development. One of the key differentiators is the defect modelling step which takes the physical defects into consideration and captures their impact on the electrical parameters, hence enabling accurate fault modelling. The latter systematically defines the complete (theoretical) memory fault space and thereafter systematically performs the fault analysis (using defect modelling of the first step and circuit simulation) to validate the space. This step provides insight information not only on the nature of realistic faults, but also about the best way to test them, which is used in the third step of DAT (test development). As an example, a fault resulting in a wrong read value can be easily detected with a March test as it is able to sensitize the fault, while a fault resulting in a random read value needs special design-for-testability (DfT) to guarantee its detection. The present invention methods have been applied on R-RAM and STT-MRAM memory devices and demonstrate the superiority of this approach as compared to conventional memory test approaches. DAT can model and detect some of the device defects that cannot be detected by the conventional approach. Hence, it can further reduce the amount of test escapes and can even better diagnose defects for fast yield learning.

The present invention applies to integrated circuit devices 1 relating to any memory technology including emerging memory technologies such as PCM, R-RAM and STT-MRAM. It is described herein using two exemplary memory technologies: resistive random access memory (R-RAM) and spin transfer torque magnetic random access memory (STT-MRAM). The results show that the present invention embodiments are able to sensitize faults for defects that are not detected with the traditional approach, meaning that the latter cannot lead to high-quality test solutions as required for defective part per billion (DPPB) level. The new approach clearly sets up a turning point in testing at least for the considered two emerging memory technologies.

Traditional memory testing assumes that a device defect can be modeled as a linear resistor in series or in parallel with the device. However, we have shown that this approach is not accurate at least for emerging memory technologies such as R-RAM and STT-MRAM, resulting in incomplete or inaccurate fault modeling. The present invention embodiments of Device-Aware Test (DAT) aims at solving this problem, and setting up a step toward meeting DPPB-level requirement. First, the integrated circuit device 1 defects are physically modeled and their electrical behaviors are incorporated into device models. Second, the model is integrated in a memory simulation platform in order to analyze the impact of the defect on memory behavior; this is done in a systematic manner by validating a pre-defined fault framework/space, e.g. using SPICE simulations. The results of this step provide insights on the nature of realistic faults, which is used in order to develop optimal and appropriate test solutions (e.g., March test, DfT).

Inaccurate defect modeling may result in poor fault models, thereby limiting the effectiveness of proposed test solutions and DfT designs, not only in terms of defect coverage but also in terms of test time. For example, a test targeting a fault model that does not represent any real defect will not increase the defect coverage while still consuming test time. To accurately model physical defects, the device model should incorporate the way the defect impacts the technology parameters (e.g., length, width, density) and thereafter the electrical parameters (e.g., the critical switching current) of the integrated circuit device 1.

FIG. 1 shows the flow of such modeling approach as a schematic presentation of a defect modelling part of an embodiment of the device aware test according to the present invention. A (defect free) model 1a of an integrated circuit device 1, and a defective model 1b are used as basic inputs. The eventual possible output is an optimized defect-parameterized model 17 of the defective integrated circuit device 1. Note that in general an integrated circuit device 1 as used herein can be a FinFET transistor, an STT-MRAM device, an R-RAM device, a PCM device, etc.

The present invention approach for defect modelling includes three steps. Physical defect analysis and modeling 10 comprises that, given a set of physical defects $D=\{d_1, d_2, \ldots, d_n\}$ that may take place during the manufacturing process of the integrated circuit device 1, each defect $d_i$ has to be analyzed to fully understand the defect mechanism and identify its impact on each (key) technology parameter Tp of the integrated circuit device 1. Due to such a defect, one or more (defect free) technology parameters $Tp_{df}$ will be modified, resulting in what is referred to as an effective technology parameter $Tp_{eff}$. This can be described by the following abstract function:

$$Tp_{eff}(S_i) = f_i(Tp_{df}, S_i) \quad (1)$$

where $Tp_{df}$ is the defect-free technology parameter, $f_i$ is a mapping function corresponding to defect $d_i$ (i=1 . . . n), and $S_i = \{x_1, x_2, \ldots, x_t\}$ is a set of parameters representing the size or strength of defect $d_i$.

To obtain the effective technology parameters $Tp_{eff}$, the physical defect analysis 10 comprises identifying a set of possible physical defects D (that can take place during the manufacturing of the integrated circuit device) and their characteristics. The possible physical defects D comprise e.g. for a memory device, one or more of a forming defect in a R-RAM cell of the memory device, electrode roughness a R-RAM cell of the memory device, a pin-hole defect in a STT-MRAM cell of the memory device, extreme thickness variation of tunnel barrier in defect in a STT-MRAM cell of the memory device, etc.

In the electrical modeling step 11 of the defective integrated circuit device 1, the impact of the altered technology parameters $Tp_{eff}$ from the previous step 10 on each of the key electrical parameters of the integrated circuit device 1 is identified (e.g. using electrical equations 15 as indicated). The resulting electrical parameters are therefore qualified to describe the electrical behavior of the defective integrated circuit device 1 with defect $d_i$. One way to perform this, is by modifying the defect-free device electrical model and converting it into a defect-parameterized electrical model 16 by integrating Equation (1) of each involved technology parameter Tp. This step gives a raw defective device model 16 with the effective electrical output parameters.

In a third step 12, a further refinement can be made, i.e. defect modelling of the integrated circuit device 1 further comprises calibration 12 of the defect-parametrized electrical model 16. This may be implemented by fitting and optimizing the defect-parametrized electrical model 16 based on actual measurements on a integrated circuit device 1 having defects, resulting in the optimized defect-parameterized electrical model 17 as shown in FIG. 1. If any physical or electrical parameters of the defective model do not accurately match the characterization data, it is necessary to keep optimizing the device model until an acceptable accuracy is obtained. By performing silicon data fitting and model optimization, it is possible to derive an optimized defect-parameterized electrical model 17, which enables accurate circuit simulation for fault modeling.

The second DAT step is fault modeling. In this step, the (optimized) defect models 16, 17 from the previous step are used to analyze the behavior of an integrated circuit device 1 in the presence of defects. The results from this analysis are used to develop a high-quality test. Thus, in a further invention embodiment, fault modelling 20 comprises a fault analysis 22 based on the defect-parametrized electrical model 16; 17 of the integrated circuit device 1.

In an exemplary embodiment, the fault space is defined that describes and classifies all possible faults for the targeted integrated circuit device (e.g., STT-MRAM, R-RAM, PCM, etc.). Secondly, a fault analysis methodology is described below (in more detail with reference to FIG. 2) that determines which faults from the space are realistic for the defect under consideration, i.e. which faults can be sensitized in the presence of such a defect. To that end, an embodiment is provided wherein the fault analysis 22 comprises defining a fault space comprising a description of a plurality of possible faults 23, 24, and determining which of the plurality of possible faults 23, 24 can be sensitized during executing the test on the integrated circuit device 1.

In a further exemplary embodiment, the fault analysis 22 comprises determining a list of possible faults 23, 27, the list of possible faults comprising easy-to-detect (e.g., strong faults 23 and/or hard-to-detect faults 27 (e.g., weak faults, faults resulting in random read, etc.) An easy-to-detect fault 23 is a functional fault that can be detected by applying a sequence of operations on the integrated circuit device 1. A hard-to-detect fault 27 is a fault causing a parametric fault in the integrated circuit device 1 (e.g. a reduction in bit line current, or a fault causing random or unpredictable read).

In an advantageous embodiment, the integrated circuit device 1 is a memory device 1. In a further advantageous embodiment, the integrated circuit device is a logic device 1. In this respect, a number of embodiments and examples can be envisaged for a memory device 1.

In an example, the analysis is limited to static and dynamic single-cell faults. A static fault is defined as a fault that can be sensitized by performing at most one operation, while a dynamic fault is sensitized by more than one operation. If more than one cell is involved in the fault, the fault is called a coupling fault. A strong fault can be systematically described using the fault primitive (FP) notation. An FP describes the difference between the observed and expected memory device 1 behavior, denoted as a three-tuple (S/F/R) where S denotes the operation sequence that sensitizes the fault. A sequence takes the form of $S = x_0 O_1 x \ldots O_n x_n$, where x is '0' or '1' and O is an operation with value r (read) or w (write), 0 and 1 denote logical cell values. If n≤1, the fault is static, else dynamic.

F describes the value that is stored in the cell after S is performed. For traditional charge-based memories, e.g., SRAM, there exist only two digital states, i.e., F is either '0' or '1'. However, emerging memory technologies like R-RAM and STT-MRAM use a resistive storage element; pre-defined resistance ranges determine the logic state of the cell in a memory device 1. Due to defects or extreme process variations, the state of such memory devices 1 can be outside these ranges, hence the need of the definition of other (faulty) resistance states L, U, and H. A measured resistance distribution of a large number of 60 nm MTJ STT-MRAM memory devices 1 show that F is one of {0; 1; U; L; H}. Each point in the distribution represents a memory device 1 whose $R_P$ is shown on the x-axis and $R_{AP}$ on the y-axis (resistance in parallel P state $R_P$, resistance in anti-parallel AP state $R_{AP}$). From a design perspective, the nominal $R_P$ is e.g. 2 kΩ and the nominal $R_{AP}$ is 5 kΩ, which assures a good read reliability with tunnelling magneto-resistance ratio TMR=150%. A 3σ of the nominal values can be used to define the resistance ranges of the two states 0 and 1. Next to devices 1 within specification, there is also a large number of devices 1 outside the specification due to some defects or extreme process variations. These are: (1) extreme low resistance state 'L', 2) extreme high resistance state 'H', and 3) undefined state 'U'. Note that the definitions of states '0' and '1' for STT-MRAM differ from R-RAM, where state '0' stands for high resistance while '1' for low resistance.

R describes the output of a read operation if S is a read operation and has a value of '0', '1', '?' or where '?' denotes a random read value (e.g., the sensing current is very close to sense amplifier reference current), and '-' denotes that R is not applicable, i.e., when S is a write operation.

TABLE I

Single-cell static fault primitives

| # | S | F | R | FP notation | Name |
|---|---|---|---|---|---|
| 1 | 1 | 0 | — | (1/0/—) | $SF1_0$ |
| 2 | 0 | 1 | — | (0/1/—) | $SF0_1$ |
| 3 | 1 | U | — | (1/U/—) | $SF1_U$ |
| 4 | 0 | U | — | (0/U/—) | $SF0_U$ |
| 5 | 1 | L | — | (1/L/—) | $SF1_L$ |
| 6 | 0 | L | — | (0/L/—) | $SF0_L$ |
| 7 | 1 | H | — | (1/H/—) | $SF1_H$ |
| 8 | 0 | H | — | (0/H/—) | $SF1_H$ |
| 9 | 1w0 | 1 | — | (1w0/1/—) | $WTF1_1$ |
| 10 | 0w1 | 0 | — | (0w1/0/—) | $WTF0_0$ |
| 11 | 1w0 | U | — | (1w0/U/—) | $WTF1_U$ |
| 12 | 0w1 | U | — | (0w1/U/—) | $WTF0_U$ |
| 13 | 1w0 | L | — | (1w0/L/—) | $WTF1_L$ |
| 14 | 0w1 | L | — | (0w1/L/—) | $WTF0_L$ |
| 15 | 1w0 | H | — | (1w0/H/—) | $WTF1_H$ |
| 16 | 0w1 | H | — | (0w1/H/—) | $WTF0_H$ |
| 17 | 1w1 | 0 | — | (1w1/0/—) | $WDF1_0$ |
| 18 | 0w0 | 1 | — | (0w0/1/—) | $WDF0_1$ |
| 19 | 1w1 | U | — | (1w1/U/—) | $WDF1_U$ |
| 20 | 0w0 | U | — | (0w0/U/—) | $WDF0_U$ |
| 21 | 1w1 | L | — | (1w1/L/—) | $WDF1_L$ |
| 22 | 0w0 | L | — | (0w0/L/—) | $WDF0_L$ |
| 23 | 1w1 | H | — | (1w1/H/—) | $WDF1_H$ |
| 24 | 0w0 | H | — | (0w0/H/—) | $WDF0_H$ |
| 25 | 1r1 | 1 | 0 | (1r1/1/0) | $IRF1_1$ |
| 26 | 0r0 | 0 | 1 | (0r0/0/1) | $IRF0_0$ |
| 27 | 1r1 | 1 | ? | (1r1/1/?) | $RRF1_1$ |
| 28 | 0r0 | 0 | ? | (0r0/0/?) | $RRF0_0$ |
| 29 | 1r1 | 0 | 0 | (1r1/0/0) | $IRDF1_0$ |
| 30 | 0r0 | 1 | 1 | (0r0/1/1) | $IRDF0_1$ |
| 31 | 1r1 | U | 0 | (1r1/U/0) | $IRDF1_U$ |
| 32 | 0r0 | U | 1 | (0r0/U/1) | $IRDF0_U$ |
| 33 | 1r1 | L | 0 | (1r1/L/0) | $IRDF1_L$ |
| 34 | 0r0 | L | 1 | (0r0/L/1) | $IRDF0_L$ |
| 35 | 1r1 | H | 0 | (1r1/H/0) | $IRDF1_H$ |
| 36 | 0r0 | H | 1 | (0r0/H/1) | $IRDF0_H$ |
| 37 | 1r1 | 0 | 1 | (1r1/0/1) | $RDF1_0$ |
| 38 | 0r0 | 1 | 0 | (0r0/1/0) | $RDF0_1$ |
| 39 | 1r1 | U | 1 | (1r1/U/1) | $RDF1_U$ |
| 40 | 0r0 | U | 0 | (0r0/U/0) | $RDF0_U$ |
| 41 | 1r1 | L | 1 | (1r1/L/1) | $RDF1_L$ |
| 42 | 0r0 | L | 0 | (0r0/L/0) | $RDF0_L$ |
| 43 | 1r1 | H | 1 | (1r1/H/1) | $RDF1_H$ |
| 44 | 0r0 | H | 0 | (0r0/H/0) | $RDF1_H$ |
| 45 | 1r1 | 0 | ? | (1r1/0/?) | $RRDF1_0$ |
| 46 | 0r0 | 1 | ? | (0r0/1/?) | $RRDF0_1$ |
| 47 | 1r1 | U | ? | (1r1/U/?) | $RRDF1_U$ |
| 48 | 0r0 | U | ? | (0r0/U/?) | $RRDF0_U$ |
| 49 | 1r1 | L | ? | (1r1/L/?) | $RRDF1_L$ |
| 50 | 0r0 | L | ? | (0r0/L/?) | $RRDF0_L$ |
| 51 | 1r1 | H | ? | (1r1/H/?) | $RRDF1_H$ |
| 52 | 0r0 | H | ? | (0r0/H/?) | $RRDF0_H$ |

Table I lists all single-cell static FPs and their names. The naming of the FPs follows the following scheme: FP={read impact} {behavior} {initial}$_{\{F\}}$ (2)

Here, {read impact} is applicable only if a read sensitizing operation results in a faulty read: incorrect (I), or random (R) read values. {behavior} describes the behavior of the faulty cell: it specifies the nature of the operation (read (R) or write (W)) and the resulting fault effect (destructive (D), transition (T), or nothing). For example, 'WDF' means write destructive fault. {initial} describes the initial state of the cell and F is the value that is stored in the cell after S is performed.

For example, RRDF01=(0r0/1/?) is the Random Read Destructive Fault that puts the cell into '1' during a read '0', and returns a random read value at the output. State faults are an exception to this scheme because no sensitizing operation is performed. Their names follow this scheme:

$FP=SF\{initial\}_{\{F\}}$.

For dynamic faults, the name of an FP gets the prefix nd where n denotes the number of operations in S and the FP is based on the last operation in S, e.g., (1r1w0/L/–) is 2d-WTF1$_L$.

Integrated circuit faults can be classified into two types: strong and weak faults. Strong faults are functional faults that can always be sensitized (and may be detected) by applying a sequence of operations and can cause functional errors; e.g., all FPs of Table I are strong faults. In contrast, weak faults do not result in FPs, but they cause parametric faults, e.g., a reduction in bit line current during a read operation. Note that these faults cannot be detected with any sequence of operations as they do not cause any functional errors. Obviously, these faults need to be also detected as they cause reliability problems (e.g., shorter lifetime, higher infield failure rate). Depending on the effort needed to detect them, faults can be further divided into easy-to-detect faults 23 and hard-to-detect faults 27. The detection of easy-to-detect faults 23 can be simply guaranteed by applying write and read operations, e.g., by using a March test. The detection of hard-to-detect faults 27, however, cannot be guaranteed by just March tests and their detection requires additional effort; e.g., use of a special circuitry such as DfT. Note that strong faults may include of easy-to-detect and hard-to-detect faults 23, 27, while weak faults are all hard-to-detect faults 27. Examples of strong hard-to-detect faults 27 are random read faults such as RRF11 and RRF00. For example, in an STT-MRAM with a small defect, the bit-line current during a read may be very close to the reference current of the sense amplifier causing random behavior between devices.

Figure 2:
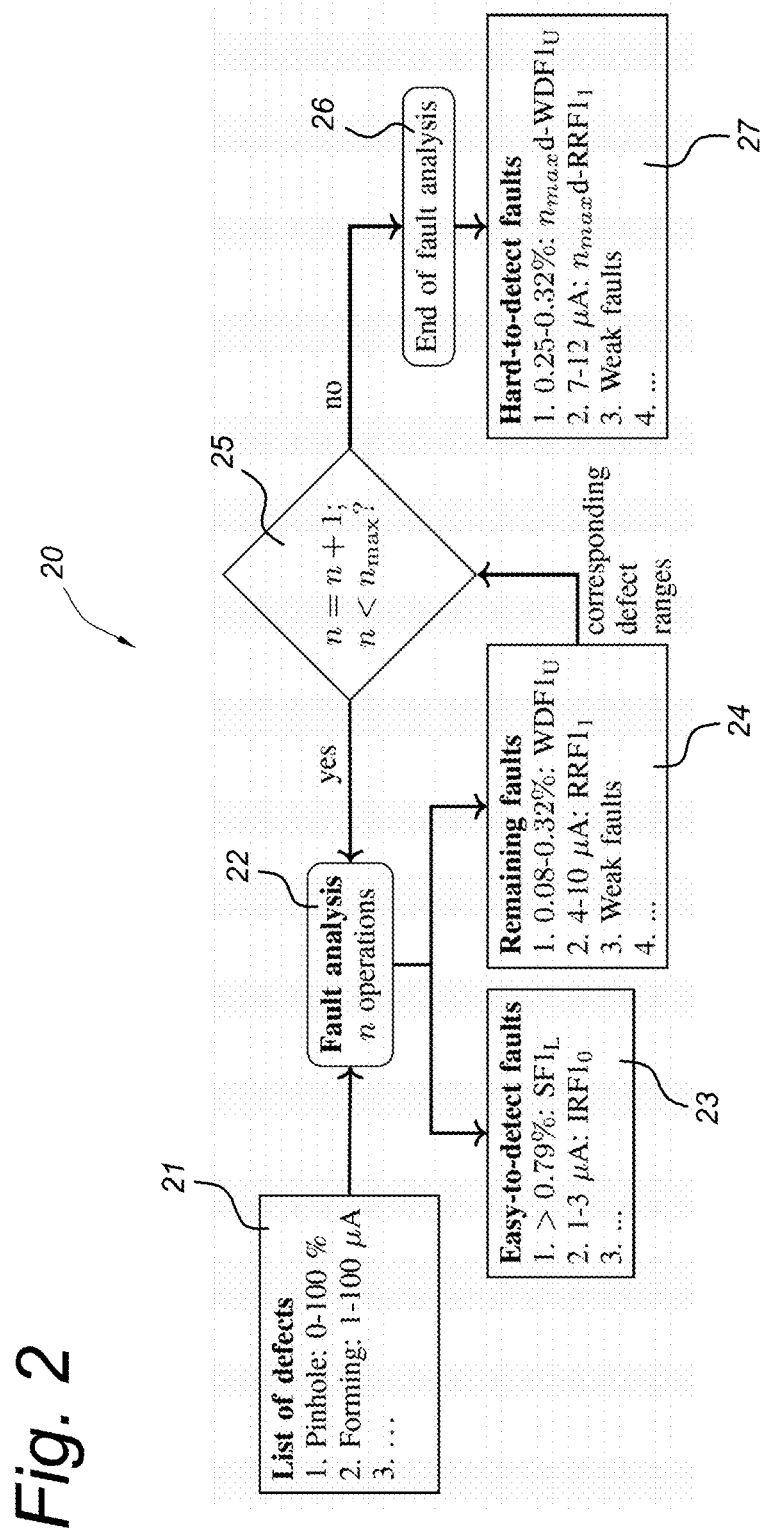

Once the defect is modeled and the framework of faults is defined, the validation of the faults can be performed using a systematic circuit simulation approach. In this description, this is limited to examples involving single-cell fault analysis. An example of such a fault analysis is shown in the graph of FIG. 2. The fault analysis 20 may comprise seven steps: 1) circuit generation, 2) defect injection, 3) stimuli generation, 4) circuit simulation, 5) fault analysis, 6) fault primitives identification, and 7) defect size sweeping, and repetition of steps 2 to 6 till all sizes are covered. Note that in the described exemplary case, defect injection means changing the electrical model 16; 17 of the integrated circuit device 1 (e.g., R-RAM or STT-MRAM) with the defective device model 16; 17 obtained in step 1 of the DAT method embodiments, while defect size sweeping means changing the size of the defect which also modifies the electrical parameters of the defective device model 16; 17.

FIG. 2 shows a flow graph representing the methodology of fault analysis that enables to get more insight on the nature of realistic faults and the way to test them. Given a list of defects 21 and ranges of their sizes, the seven steps of the fault analysis should be first performed for the validation of static single-cell FPs of Table I (i.e., n≤1). The result will be a set of FPs classified into easy-to-detect faults 23, remaining faults 24 and hard-to-detect faults 27, associated with the size/range of the defect/parameters. In case that no FP is sensitized in the presence of a defect, the fault is considered to be weak and it is added to the list of remaining faults 24. Next, all defects that resulted in remaining faults 24 will be further analyzed, but then using dynamic fault analysis, starting at n=2. Some defects leading to remaining faults 24 can trigger now easy-to-detect faults 23. E.g., S=0w0 causes a weak fault, while S=0w0w0 causes an easy-to-detect strong fault 23. Once n=2 operation single-cell dynamic fault analysis 22 is done, similar analysis can be done for n=3 for defects that resulted in remaining faults 24 (via decision block 25). The process can be repeated by extending S each time with one operation till the considered $n_{max}$ is reached (end of fault analysis block 26). Each step in the process aims at reducing the remaining fault set 24 and increasing the easy-to-detect fault set 23. What remains then at the end of the fault analysis is a (reduced) set of hard-to-detect faults 27. This is an advantageous step towards not only optimizing test cost but also towards improving the overall product quality. The final results will be a set of faults 23 that can be easily detected by the generation of March tests, and another set of faults 27 that needs special attention in order to guarantee their detection (e.g., DfT, special tests, etc.).

The results of the fault analysis 20 facilitate the development of high-quality and efficient test solutions. All easy-to-detect faults 23 can be detected by applying appropriate test algorithms. Developing optimized algorithms starts by identifying the minimal detection conditions for each of the faults 23 and thereafter compiling them in test algorithms. This will provide fault coverage of easy-to-detect faults 23 at minimal test cost. One can also incorporate a DfT scheme in order to further optimize the test time, e.g. a DfT that enables the test of many faults 23 simultaneously, parallel testing, etc. Hard-to-detect faults 27, however, require special attention. Special DfT schemes and tests may be required. Examples are DfT schemes that may directly measure the bit line swing, modify the operation conditions such as weak write operations, stress tests, etc. The aim is to maximize the fault coverage for these faults 27 while keeping the test cost economically affordable. In general wording, the present invention thus furthermore relates to an embodiment, wherein test development comprises providing a test scheme which comprises a set of operations for the integrated circuit device 1 for each easy-to-detect fault 23 identified in the fault analysis 22, and a design for testability modification (possibly combined with set of operations) of the integrated circuit device 1 for each hard-to-detect fault 27.

Figure 3:
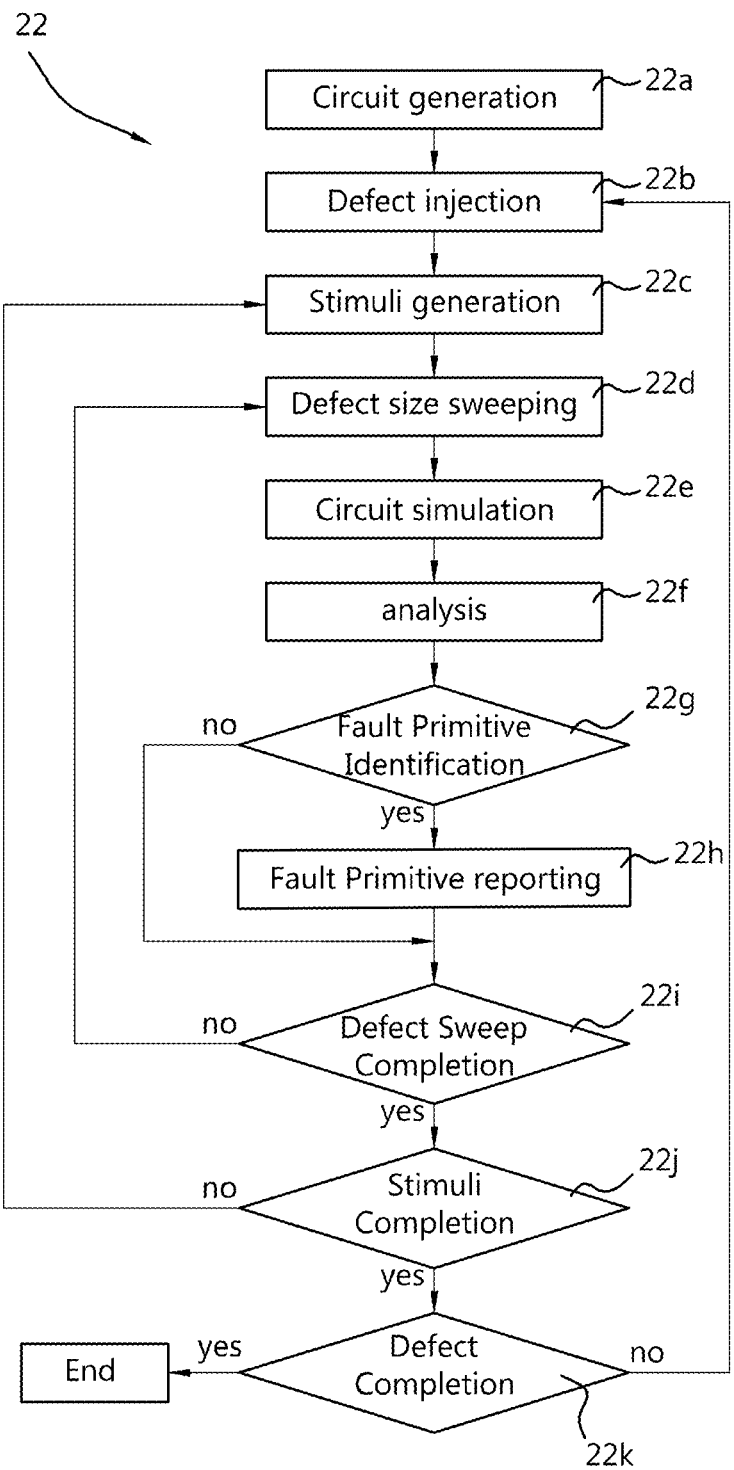
FIG. 3 shows a flow chart of an exemplary fault analysis.

In order to further improve the validation of a defect, FIG. 3 shows a flow chart representing a further methodology of fault analysis 22 that enables the validation of realistic faults using an exemplary systematic approach. The fault analysis 22 comprises multiple (operation) steps: i) circuit (netlist) generation 22a, ii) defect injection 22b, iii) stimuli generation 22c, iv) defect size sweeping 22d, v) circuit simulation 22e, vi) analysis 22f, vii) fault primitive identification 22g, viii) fault primitive reporting 22h, ix) defect sweep completion 22i, x) stimuli completion 22j and xi) defect completion 22k.

To elaborate on the flow chart shown in FIG. 3, the fault analysis 22 methodology begins with a circuit (netlist) generation 22a, which provides a description of the circuit for latter simulation purposes. Thereafter, given a list of defects 21 (as shown on FIG. 2), defect injection 22b takes place, followed by stimuli generation 22c, Next, defect size sweeping 22d of the (injected) defect occurs, whereby the size of the defect is modified, e.g. for a resistive defect, the amplitude of the resistance is changed. Thereafter, circuit simulation 22e is performed, whereby the results of the circuit simulation 22e are examined in the (fault) analysis 22f step. Once analysis 22f is completed, fault primitive identification 22g is carried out as to identify any difference between the observed and expected circuit behaviour. If a fault primitive is identified, then it is reported in the fault primitive reporting 22h step, and, in the case that no fault primitive is identified, the fault primitive reporting 22h step is skipped.

Thenceforth, if further sweeping of the defect size is required, then steps iv) to viii), i.e. defect size sweeping 22d to fault primitive reporting 22h, are repeated. Otherwise, if no further sweeping of the defect size is required, then this is noted as completed in the defect sweep completion 22i step. Similarly, in the following step, if further stimuli are to be considered, than steps iii) to ix), i.e. stimuli generation 22c to defect sweep completing 22i, are to be repeated, and, otherwise, this is noted as completed in the stimuli completion 22j step. As a final step, should there be further defects to be injected, then steps ii) to x) i.e. defect injection 22b to stimuli completion 22j are repeated. Otherwise, if all required defects are injected and examined, this is noted in the defect completion 22k step, and fault analysis 22 is completed. The methodology for the fault analysis 22, as described above, provides a systematic approach in validating a defect, allowing for an accurate and systematic framework in examining whether a defect is realistic or not. Thus, by performing an accurate fault analysis 20, this allows to derive appropriate and realistic fault models, and subsequently, test solutions.

In the following description part, the present invention DAT method embodiments are applied for a R-RAM memory device 1 by following the three main steps. However, for clarification and understanding R-RAM manufacturing defects are discussed and a representative defect is selected. The fabrication process flow of an R-RAM memory device 1 starts with manufacturing transistors on a wafer in the front-end-of-line (FEOL) production phase. Then, lower metal interconnection layers are deposited in the back-end-of-line (BEOL) phase. R-RAM memory devices 1 are typically constructed between two metal layers. After that remaining metal layers are deposited. The memory devices 1 do not have a conductive filament (CF) yet, therefore an initial CF forming step needs to be performed in order to achieve a functional memory device 1.

As an exemplary implementation of a present invention embodiment, defects that result from the CF forming step are used as example. During the forming step, an initial CF is generated in the R-RAM device 1 oxide. The conditions of this step have a strong impact on the performance of the device 1 and therefore this step may result in defects. A few observations of the forming conditions can be made: higher forming currents NA result in lower device resistance with less variation, and variations in the forming current lead to more resistive variations. Variations in the device 1 geometry and oxide defect density also affect the forming step. Two defects can result from the forming step: over-forming, when the CF is too large, and non-forming, when no or only a tiny CF is formed.

In the following paragraphs, the present invention DAT approach is used for forming defects (as case study), and compared to the conventional approach using a linear resistor to model the defect. For the DAT approach, the input parameters of the R-RAM device 1 model is related to the forming current $I_{form}$, thus incorporating the physics of the forming step, that could result in over-forming or non-forming, into the electrical model 16. The model 16 can be included in a netlist to observe its electrical effects. The forming current $I_{form}$ is directly related to the shape of the CF, i.e., it affects the key parameters of the R-RAM memory device 1: $t_{ox}$ (thickness of oxide layer between top electrode TE and bottom electrode BE), $I_{CF}$ (length of CF), $I_{gap}$ (length between CF and top electrode TE), $\phi_B$ (width of CF near bottom electrode) and $\phi_T$ (width of CF part nearest to top electrode). It is shown that $I_{CF}$ and $\phi_T$ have the strongest impact on the resistance of the R-RAM memory device 1.

Therefore, these parameters are used to model the forming effects of the memory device 1.

To include the stochastic variation of $I_{CF}$, an additional parameter $\Delta I_{CF}$ (that sets the strength of this variation) is included. These parameters are used to model the forming effects of the device 1. The physical defect modeling step can be denoted mathematically as:

$$I_{CF,\mathit{eff}}(I_{form}) = a_1 \exp(b_1 \cdot R_\mu(I_{form})) + c_1 \exp(d_1 \cdot R_\mu(I_{form})) \quad (3)$$

$$\phi_{T,\mathit{eff}}(I_{form}) = a_2 \exp(b_2 \cdot R_\mu(I_{form})) + c_2 \exp(d_2 \cdot R_\mu(I_{form})) \quad (4)$$

$$\Delta I_{CF,\mathit{eff}}(I_{form}) = a_3 \exp(b_3 \cdot R_p(I_{form})) + c_3 \exp(d_3 \cdot R_\sigma(R_\mu)) \quad (5)$$

Here, $a_k$, $b_k$, $c_k$ and $d_k$ (k=1, 2, 3) are fitting parameters. $R_\mu(I_{form}) = f(I_{form})$, where $f(I_{form})$ is a cubic Hermite interpolation of $I_{form}$ to the median resistance as described in the article by A. Grossi et al., "Fundamental variability limits of filament-based R-RAM," in IEDM, 2016, incorporated herein by reference. $R_\sigma(R_\mu)$ is given by Equation (1) in this article.

The R-RAM device model disclosed in the article by H. Li et al., "A SPICE model of resistive random access memory for large-scale memory array simulation," Electron Device Letters, vol. 35, no. 2, February 2014, incorporated herein by reference, takes $I_{CF}$, $\phi_T$ and $\Delta I_{CF}$ as input parameters. These three parameters dictate the switching behavior and the resistance of the R-RAM device 1, and thus are well suited to model the effects of forming on the device's electrical behavior. When the resulting model is simulated in a netlist, the effects on the electrical parameters, e.g., resistance, switching speed and thresholds, can be analyzed.

In the fitting and model optimization step, the three alterable parameters are calibrated so that the defective behavior of the R-RAM device 1 corresponds with measurements of real devices. To realize this, first the influence of $I_{CF}$, $\phi_T$ on the mean resistance are analyzed. These parameters are then fitted against the measurements in the Grossi article and thus are linked to $I_{form}$. The effect of $\Delta I_{CF}$ is analyzed and fitted in a similar fashion. $I_{form}$ was varied between 5 μA and 34:1 μA.

Note that the conventional resistive defect modeling approach models the forming defect as a resistor that is either parallel ($R_{pd}$) or in series ($R_{sd}$) with a defect-free R-RAM device 1.

In generic wording, a further embodiment is provided wherein the memory device 1 is a resistive random access memory (R-RAM) unit, the technology parameters Tp comprise one or more of an oxide thickness $t_{ox}$, conductive filament length $l_{CF}$, gap length $l_{gap}$, conductive filament top width $\phi_T$, conductive filament bottom width $\phi_B$, and the electrical parameters comprise one or more of reset threshold $V_{reset}$, set threshold $V_{set}$, reset resistance $R_{HRS}$, set resistance $R_{LRS}$, high resistance state to low resistance state switching delay $t_{H \to L}$, low resistance state to high resistance state switching delay $t_{L \to H}$.

The next present invention embodiment step, fault modelling, comprises a fault analysis based on the use of the electrical models generated in the defect modelling step for forming defect. A static fault analysis is done for both defect models, and then the dynamic faults for the DAT method (and traditional approach) are analyzed. As a forming defect impacts a single R-RAM device 1 cell, only single-cell faults are analyzed. The possible single-cell static faults are those listed in Table I; the dynamic fault space can be constructed by following the definitions as described above.

The fault analysis for forming defect is started by analyzing static faults. Table II lists the static faults that were sensitized both with the DAT approach as well as the conventional (conv.) approach for all $I_{form}$, $R_{pd}$, and $R_{sd}$.

TABLE II

Fault sensitization using device-aware versus resistive defect model

| FP # | DAT | Conv. |
|---|---|---|
| 1 | no | no |
| 2 | no | no |
| 3 | yes | no |
| 4 | no | no |
| 5 | no | no |
| 6 | no | no |
| 7 | no | no |
| 8 | yes | no |
| 9 | no | yes |
| 10 | no | yes |
| 11 | no | yes |
| 12 | no | yes |
| 13 | no | no |
| 14 | no | yes |
| 15 | yes | no |
| 16 | yes | yes |
| 17 | no | no |
| 18 | no | no |
| 19 | yes | no |
| 20 | no | no |
| 21 | no | yes |
| 22 | no | no |
| 23 | no | no |
| 24 | yes | yes |
| 25 | no | yes |
| 26 | no | yes |
| 27 | no | no |
| 28 | no | no |
| 29 | no | no |
| 30 | no | no |
| 31 | no | no |
| 32 | no | no |
| 33 | no | no |
| 34 | no | no |
| 35 | no | no |
| 36 | no | no |
| 37 | no | no |
| 38 | no | no |
| 39 | yes | no |
| 40 | no | no |
| 41 | no | yes |
| 42 | no | no |
| 43 | no | no |
| 44 | yes | no |
| 45 | no | no |
| 46 | no | no |
| 47 | no | no |
| 48 | no | no |
| 49 | no | no |
| 50 | no | no |
| 51 | no | no |
| 52 | no | no |

The unique faults that are sensitized by both approaches (6 and 9, respectively) and their overlapping faults (2) clearly show the difference between the approaches. The unique DAT faults (6 out of 8 of the realistic faults which corresponds to 75%) may lead to test escapes in case tests that are used based on the conventional defect model. On top of that, the conventional defect model approach triggers 9 faults which are not realistic, hence leading to a waste of test time. Note that only 2 common faults are observed between both approaches. The fault analysis is then continued with two case studies in which we increase the length of S, i.e., we sensitize dynamic faults.

Figure 4:
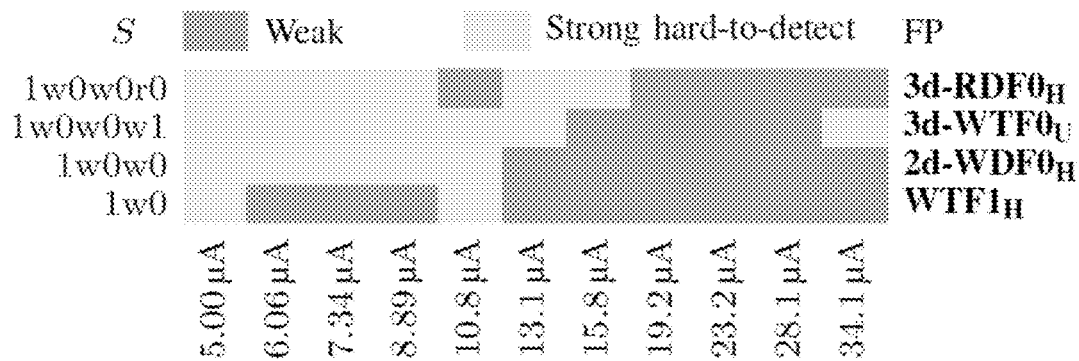
FIG. 4 shows a table of fault class and FP for R=RAM forming defect faults.

FIG. 4 shows the fault class and FP for the strong faults that were observed for varying $I_{form}$ on the same row of their sensitizing operation. The sequences were chosen to illustrate that more strong faults are sensitized with increasing length of S. The longer the sensitizing sequence, the stronger the fault becomes. Note that the faults are still hard-to-detect faults 27 (name bold faced in FIG. 4). This can be explained by the fact that lower $I_{form}$ results in increased R-RAM device 1 resistance (both $R_{LRS}$ and $R_{HRS}$), or even non-forming defects. Due to this increase, the cells are unable to switch in the valid '1' region and instead switch into the 'U' region, while cells that have to switch into the '0' region end up in the 'H' region, as illustrated by the FPs. Note that despite the faults being strong hard-to-detect, they can still be caught easier than weak faults. FIG. 4 shows further that the ranges of fault types are interrupted. This is caused by the stochastic behavior of the filament growth and rupture, sometimes bringing the cell in an unpredicted state.

Figure 5:
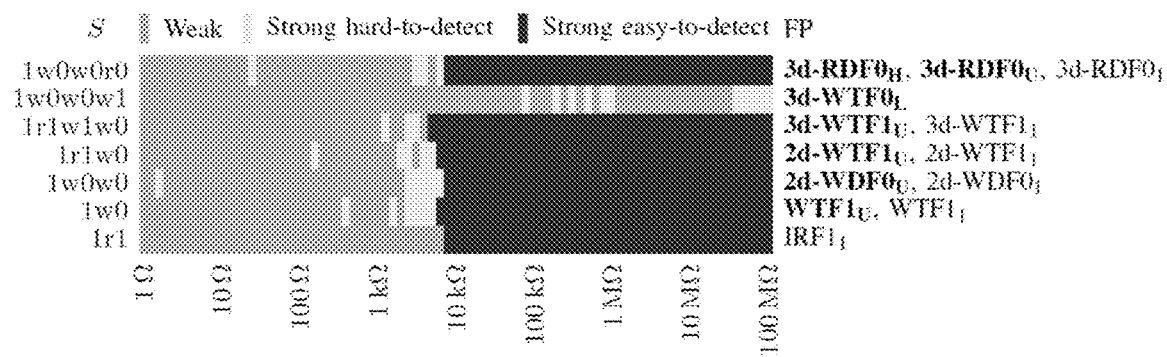
FIG. 5 shows a table of fault class and FP for R-RAM series resistor faults.

The application of the methodology to traditional resistive defects is shown in FIG. 5 for $R_{sd}$. Again, strong hard-to-detect faults are marked bold faced while easy-to-detect faults in regular font. Table IV also shows that the fault coverage increases when the length of S is increased. For example, for a defect size of R=5.01 kΩ both strong hard-to-detect faults (for the sequence S=1r1w0) as well as strong easy-to-detect faults (for the sequence S=1r1w1w0) can be observed. The first sequence leads to a 2d-WTF 1U strong hard-to-detect fault, while the second sequence enhances the faulty behavior and causes a strong easy-to-detect 3d-WTF11 fault.

For comparison, FIG. 5 also shows the same sequences that were shown in FIG. 4. A difference can be seen here which is that the resistive defect model is unable to switch to the '0' state with increasing resistance, while the device-aware defect model shows that the device is still switching between the states.

This difference is caused by the fact that the series resistor reduces the voltage over the R-RAM device 1, and hence, the switching threshold is never reached. From the above, it follows that the present invention DAT approach and the conventional approach result in the sensitization of different faults. The device-aware model is always able to show the switching of the cell, while the resistive defect model only shows switching behavior for a limited defect range, thus incorrectly modeling this defect. Using an inappropriate defect model would lead to low-quality tests that detect non-existing faults and miss existing ones. Further, it follows that the analysis methodology is able to increase the fault coverage by extending the length of S. This extension may have defects turn the fault behavior from weak hard-to-detect faults into strong hard-to-detect ones, and strong hard-to-detect faults into strong easy-to-detect ones, thus increasing their detection probability.

The results from the previous step are used to develop an R-RAM test step. In the fault modeling step it was observed that faults caused by these defects are related to the R-RAM memory device 1 being in a wrong state (i.e., 'U', 'L' or 'H') causing hard-to-detect faults 24. Therefore, a DfT scheme is required that focuses on detecting if a cell is in one of these states. In the article by S. Hamdioui et al., "Testing open defects in memristor-based memories," Transactions on Computers, vol. 64, no. 1, January 2015, incorporated herein by reference, a Short Write Time and Low Write Voltage DfT scheme is described that can be used to detect if the resistance of a cell is in the 'U' state. Note that modifications to this scheme would allow the detection of cells in the 'L' and 'H' state as well. In contrast, the $R_{sd}$ defect model sensitizes many strong easy-to-detect faults, e.g. IRF$1_1$ and WTF$1_1$, which are not realistic. Although they may be easily detected by the $\updownarrow$ (w1; r1) element in a March test, testing for them would still increase test cost unnecessary.

In the following paragraph, the present invention DAT approach is used, and compared to the conventional approach, for a memory device 1 based on STT-MRAM technology. Examples of STT-MRAM manufacturing defects are described with a particular emphasis on pinhole defects, which is then taken as subject for the application of the present invention embodiments.

The STT-MRAM manufacturing process mainly comprises of the standard CMOS fabrication steps and the integration of magnetic tunnel junction (MTJ) devices into metal layers. The bottom-up manufacturing flow and the vertical multi-layer structure of STT-MRAM cells are known to the person skilled in the art, see e.g. the article by Y. J. Song et al., "Highly functional and reliable 8 Mb STT-MRAM embedded in 28 nm logic," in IEDM, 2016, which is incorporated herein by reference. Based on the manufacturing phase, STT-MRAM defects can be classified into front-end-of-line (FEOL) and back-end-of-line (BEOL) defects. As MTJs are integrated into metal layers during BEOL processing, BEOL defects can be further categorized into MTJ fabrication defects and metalization defects.

TABLE V

STT-MRAM defect classification

| FEOL | BEOL | |
| --- | --- | --- |
| Transistor fabrication | MTJ fabrication | Metalization |
| Material impurity | Pinholes in TB | Open |
| Crystal imperfection | Extreme thickness variation of TB | vias/contacts |
| Pinholes in | MgO/CoFeB interface roughness | Irregular shapes |
| gate oxides | Atom inter-diffusion | Big bubbles |
| Shifting of dopants | Redepositions on MTJ sidewalls | Small particles |
| | Magnetic layer corrosion | |
| | Magnetic coupling | |

Table V list some potential defects for the STT-MRAM memory device 1. Among these defects, pinhole defects in the MgO tunnel barrier are seen as one of the most important defects that may occur in STT-MRAM memory devices. A pinhole defect forms due to unoptimized deposition processes. This causes the formation of metallic shorts in the MgO tunnel barrier, probably due to diffusion of Boron into the MgO barrier or other metallic impurities. As a result, it leads to a degradation of both resistance area product (RA) and tunneling magneto-resistance ratio (TMR) parameters. Moreover, a small pinhole may grow in area over time because of Joule heating and an electric field across the pinhole circumference. Therefore, if even small pinhole defects are not detected during manufacturing tests, they might cause an early breakdown in the field.

For the conventional resistor-based defect modeling approach, a pinhole defect is modeled as a series resistor $R_{sd}$ or a parallel resistor $R_{pd}$, similar to the case for modeling the forming defect in R-RAM memory devices 1 as described above.

With comprehensive theoretical studies and experimental characterizations for pinhole defects in various MTJ devices, it is clear that RA and TMR are the two key technology parameters that are significantly impacted by a pinhole defect. Thus, as the first part of the DAT method implementation, the effect of pinholes on these two technology parameters are modelled as follows.

$$RA_{eff\_ph}(A_{ph}) = \frac{A}{\frac{A(1-A_{ph})}{RA_{df}} + \frac{A \cdot A_{ph}}{RA_{bd}}} \quad (6)$$

$$TMR_{eff\_ph}(A_{ph}) = TMR_{df} \cdot \frac{RA_{eff\_ph}(A_{ph}) - RA_{bd}}{RA_{df} - RA_{bd}} \quad (7)$$

where $A_{ph}$ (having a range between 0 and 1) is the normalized pinhole area with respect to the cross-sectional area A of the MTJ device. $RA_{df}$ and $TMR_{df}$ are the defect-free MTJ's RA and TMR parameters (i.e., when $A_{ph}=0$), respectively. $RA_{bd}$ is the resultant RA after breakdown.

As the next step in the embodiment method, the Equations (6) and (7) are integrated into a defect-free MTJ compact model which has been calibrated by the measurement data of good devices. In this way, we convert the defect-free MTJ model into a defective MTJ model which is able to predict the electrical impact of pinhole defects on the MTJ device. Furthermore, the pinhole size is tunable by changing the input argument $A_{ph}$.

Fitting and model optimization is then applied by performing electrical characterizations for both good MTJ devices and devices with suspected pinhole defects. By fitting to the measured silicon data, it is then possible to further optimize the pinhole-parameterized MTJ compact model. By stressing a device with a suspected pinhole defect and curve fitting method, a value of $RA_{bd}=0.41\ \Omega \cdot \mu m^2$ was found.

In generic wording, a further embodiment is provided wherein the memory device 1 is a spin-transfer torque magnetic random access memory (STT-MRAM) unit, the technology parameters Tp comprise one or more of resistance area product RA, tunnelling magneto-resistance ratio TMR, magnetic anisotropic field of the free layer $H_k$, saturation magnetization of the free layer $M_s$, potential barrier height of the tunnel barrier φ, and the electrical parameters comprise one or more of resistance in P state $R_P$, resistance in AP state $R_{AP}$, critical switching current $I_C$, average switching time $t_W$.

As the next step, the present embodiments fault modeling methodology is applied to pinhole defects, by performing a fault analysis with the DAT method approach.

TABLE VI single cell static fault modeling results for STT-MRAM memory device

| Defect Model | Value | Sensitized Fault Primitive | Detection Condition |
|---|---|---|---|
| Pinhole area $A_{ph}$ | 0-0.04% | Fault-free | DfT needed |
| | 0.05-0.07% | SF1$_U$, WDF1$_U$, WTF0$_U$, RDF1$_U$ | |
| | 0.08-0.32% | SF0$_L$, SF1$_U$, WDF0$_L$, WDF1$_U$, WTF0$_U$, WTF1$_L$, RDF0$_L$, RDF1$_U$ | |
| | 0.33-0.35% | SF0$_L$, SF1$_U$, WDF0$_L$, WDF1$_U$, WTF0$_U$, WTF1$_L$, RDF0$_L$, RRDF1$_U$ | |
| | 0.36-0.61% | SF0$_L$, SF1$_U$, WDF0$_L$, WDF1$_U$, WTF0$_U$, WTF1$_L$, RDF0$_L$, IRDF1$_U$ | ⇕ (r1) |
| | 0.62-0.78% | SF0$_L$, SF1$_0$, WDF0$_L$, WDF1$_0$, WTF0$_0$, WTF1$_L$, RDF0$_L$, IRDF1$_0$ | ⇕ (r1) |
| | >0.79% | SF0$_L$, SF1$_L$, WDF0$_L$, WDF1$_L$, WTF0$_L$, WTF1$_L$, RDF0$_L$, IRDF1$_L$ | ⇕ (r1) |

TABLE VI-continued single cell static fault modeling results for STT-MRAM memory device

| Defect Model | Value | Sensitized Fault Primitive | Detection Condition |
|---|---|---|---|
| Series resistor | 0-310 Ω | Fault-free | DfT needed |
| | 310-3.1 kΩ | IRF0$_0$ | ⇕ (r0) |
| $R_{sd}$ | 3.1 k-∞ Ω | IRF0$_0$, WTF0$_0$, WTF1$_1$ | ⇕ (r0) |
| Parallel resistor | 0-1.1 kΩ | IRF1$_1$, WTF0$_0$, WTF1$_1$ | ⇕ (r1) |
| | 1.1 k-3.1 kΩ | IRF1$_1$, WTF1$_1$ | ⇕ (r1) |
| $R_{pd}$ | 3.1 k-∞ Ω | Fault-free | DfT needed |

Table VI shows that sufficiently large pinholes ($A_{ph}$>0.62%) make the MTJ device fall into the resistance range of '0' state or even 'L' state. The corresponding fault primitives FP are listed in table VI. As the pinhole gets smaller ($A_{ph}$ between 0.08% and 0.61%), it transforms $R_P$ into 'L' state and $R_{AP}$ into 'U' state. Depending on the exact MTJ resistance in the AP state, the readout value can be in three cases: 1) '0', 2) random ('?'), and 3) '1'. In case 1) where $R_{AP}$ is significantly smaller than the resistance of the reference cell (i.e., $A_{ph}$ between 0.36% and 0.61%), the readout value of the device in AP state is '0'. In case 2) where $R_{AP}$ is close to the resistance of the reference cell (i.e., $A_{ph}$ between 0.33% and 0.35%), the readout value can be random. In other words, the read operation is unstable, and therefore both '0' and '1' are possible readout values. In case 3) where $R_{AP}$ is much larger than the resistance of the reference cell (i.e., $A_{ph}$ between 0.08% and 0.32%), the readout is T. As the pinhole area becomes smaller between 0.05% to 0.07%, the expected '1' state transforms to a 'U' state, while the expected '0' state remains correct. If the pinhole size is smaller than 0.04%, the device behaves normally, leading to no deterministic faults.

In contrast, fault modeling was performed based on the injection of the $R_{sd}$ and $R_{pd}$ into a defect-free netlist, i.e. the prior art approach, the simulation results of which are also shown in Table VI. Comparing the fault modeling results based on the two defect modeling approaches reveals that the faulty behavior of the memory device 1 due to a pinhole defect cannot be caught with the conventional resistor-based defect modeling approach. It is clear from table VI that the FPs sensitized by the present invention embodiments pinhole defect model are not observed in the simulation results with the conventional approach. This is because the MTJ device 1 is considered as a black box for the conventional approach. Thus, only '0' and '1' states are seen in the simulations. However, simulations and measurement data using the present invention embodiments clearly show that pinhole defects can lead the device to states 'U' and 'L'. This means that relying on the traditional approach for fault modeling and test development may result in low quality test solutions, meaning higher number of escapes. The conventional approach results in some fault primitives which are not applicable to STT-MRAMs (i.e., not found with our approach based on a calibrated model for the pinhole defect). For example, using a series resistor $R_{sd}$ results in IRF0$_0$, while using a parallel resistor $R_{pd}$ results in WTF0$_0$. This may lead to tests targeting non-existing faults, meaning a waste of test time.

Based on the simulation results with the calibrated pinhole defect model, it is clear that the larger the pinhole, the larger its fault effect, and hence the easier it is to detect it. As shown in Table VI, a pinhole defect with a specific range of defect sizes can cause multiple faults. However, any test that is able to detect one of these faults can guarantee the detection of this specific pinhole defect. For example, when the pinhole area $A_{ph}$ is larger than 0.79%, there are eight sensitized fault primitives FP. Among these FPs, $SF1_L$ (marked with bold font in the table) can simply be detected by a read '1' operation, because these are strong easy-to-detect faults. Thus, $\updownarrow$(r1) is the detection condition in a March algorithm for a pinhole with $A_{ph}$>0.79%. The detection conditions for different pinhole sizes are listed in the last column of Table VI. Combining the last three rows in Table VI, it is clear that any March tests including the element $\updownarrow$(w1,r1) can guarantee the detection of a pinhole defect with $A_{ph}$>0.36% as an easy-to-detect fault. However, for smaller pinhole defects, March tests cannot guarantee their detection, because the defect causes hard-to-detect faults. As small pinhole defects grow in area over time due to the accumulated Joule heating, they might cause an early breakdown in the field if not detected during manufacturing tests. This calls for DfT designs or stress tests dedicated to detecting a tiny pinhole defect. One possible solution is to subject the STT-MRAM memory device 1 to a hammering write '1' operation sequence with elevated voltage or prolonged pulse width to deliberately speedup the growth of pinhole defects, thereby causing easy-to-detect faults. However, this approach is prohibitively expensive for high-volume testing. In addition, the amplitude and duration of the hammering write pulse need to be carefully tuned to avoid any inadvertent destruction of good memory devices 1 while maintaining an acceptable test effectiveness and efficiency.

In accordance with the present invention, the above has described exemplary embodiments of a device-aware test approach having three distinct and subsequent steps: defect modeling, fault modeling, and test development. In contrast to conventional based resistive testing, the DAT embodiments lead to accurate fault models and thereby enable high-quality (towards DPPB-level) test.

As described for both R-RAM and STT-MRAM memory devices 1 above, the herein described DAT embodiments result in more accurate fault models which reflect the physical defects. Many faults sensitized are unique and not observed by the conventional resistor-based defect modeling approach. Hence, the present approach clearly reduces the number of test escapes and increases the test quality.

Modeling the defects accurately and creating a fault dictionary for them may speed up the yield learning process significantly. As each defect can be modeled separately using device-aware testing, instead of using resistive defect models for all defects, unique fault signatures can be created for each defect. This improves the yield learning curve, as the defects can be more accurately diagnosed based on their fault signatures.

Nowadays, companies are spending a lot of time on functional test (or system test) to compensate for the fault coverage due to the limitations of traditional fault modeling and testing. The present invention DAT embodiments allows for the development of appropriate and efficient structural tests, which can be applied at manufacturing stage; hence, significantly reducing the expensive test time spend on board testing.

Finally, the DAT embodiments are not limited to emerging memory device technologies, the approach can also be applied in the test generation for other circuits, e.g. SRAMs and logic, as well as for other kinds of devices, such as FinFETs and PCM devices.

The present invention has been described above with reference to a number of exemplary embodiments as shown in the drawings. Modifications and alternative implementations of some parts or elements are possible, and are included in the scope of protection as defined in the appended claims.

The invention claimed is:

1. A method for testing an integrated circuit device, the method comprising:
   defect modelling of the integrated circuit device,
   fault modelling of the integrated circuit device based on the information obtained from the defect modelling,
   test development based on information obtained from the fault modelling, and
   executing the test on the integrated circuit device,
   wherein the defect modelling of the integrated circuit device comprises
      executing a physical defect analysis of the integrated circuit device to provide a set of effective technology parameters modified from a set of defect-free technology parameters associated with the integrated circuit device, and
      executing an electrical modelling of the integrated circuit device using the set of effective technology parameters to provide a defect-parametrized electrical model based on a defect-free electrical model of the integrated circuit device;
   wherein fault modelling comprises a fault analysis based on the defect-parametrized electrical model of the integrated circuit device; and
   wherein the fault analysis comprises defining a fault space comprising a description of a plurality of possible faults, and determining which of the plurality of possible faults can be sensitized during executing the test on the integrated circuit device.

2. The method according to claim 1, wherein the defect modelling of the integrated circuit device comprises defect modelling of parts of the integrated circuit device.

3. The method according to claim 1, wherein the defect modelling of the integrated circuit device further comprises calibration of the defect-parametrized electrical model.

4. The method according to claim 1, wherein the physical defect analysis comprises identifying a set of possible physical defects.

5. The method according to claim 1, wherein the fault analysis comprises determining a list of possible faults, the list of possible faults comprising easy-to-detect faults, and/or hard-to-detect faults, an easy-to-detect fault being a functional fault that can be detected by applying a sequence of operations on the integrated circuit device, and a hard-to-detect fault being a fault causing a parametric fault in the integrated circuit device.

6. The method according to claim 1, wherein test development comprises providing a test scheme which comprises a set of operations for the integrated circuit device for each easy-to-detect fault identified in the fault analysis, and a design for testability modification of the integrated circuit device for each hard-to-detect fault.

7. The method according to claim 1, wherein the integrated circuit device is a memory device.

8. The method according to claim 1, wherein the integrated circuit device is a logic device.

9. The method according to claim 7, wherein the memory device is a resistive random access memory unit; the technology parameters comprise one or more of: an oxide thickness, conductive filament length, gap length, conductive filament top width, and conductive filament bottom width; and the electrical parameters comprise one or more of: reset threshold, set threshold, reset resistance, set resistance, high resistance state to low resistance state switching delay, and low resistance state to high resistance state switching delay.

10. The method according to claim 7, wherein the memory device is a spin-transfer torque magnetic random access memory unit; the technology parameters comprise one or more of: resistance area product, tunnelling magneto-resistance ratio, magnetic anisotropic field of the free layer, saturation magnetization of the free layer, and potential barrier height of the tunnel barrier; and the electrical parameters comprise one or more of: resistance in P state, resistance in AP state, critical switching current, and average switching time.

* * * * *